(12) United States Patent
Nayak et al.

(10) Patent No.: US 11,892,506 B2
(45) Date of Patent: Feb. 6, 2024

(54) METHOD AND CIRCUIT FOR AT-SPEED TESTING OF MULTICYCLE PATH CIRCUITS

(71) Applicant: MEDIATEK Singapore Pte. Ltd., Singapore (SG)

(72) Inventors: Ashish Kumar Nayak, San Jose, CA (US); Gokulakrishnan Manoharan, San Jose, CA (US); Mahesh Kumar Devani, San Jose, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 212 days.

(21) Appl. No.: 17/483,628

(22) Filed: Sep. 23, 2021

(65) Prior Publication Data

US 2022/0170982 A1 Jun. 2, 2022

Related U.S. Application Data

(60) Provisional application No. 63/118,994, filed on Nov. 30, 2020.

(51) Int. Cl.
*G11C 29/56* (2006.01)
*G01R 31/3177* (2006.01)
*G11C 11/419* (2006.01)
*G06F 1/06* (2006.01)
*H03K 5/01* (2006.01)
*G11C 7/22* (2006.01)

(52) U.S. Cl.
CPC ........... *G01R 31/3177* (2013.01); *G06F 1/06* (2013.01); *G11C 11/419* (2013.01); *H03K 5/01* (2013.01); *G11C 7/222* (2013.01)

(58) Field of Classification Search
CPC ..... G01R 31/3177; G06F 1/06; G11C 11/419; G11C 7/222; G11C 29/12015; G11C 29/56004; G11C 29/56012; H03K 5/01
USPC ........................................................ 714/729
See application file for complete search history.

(56) References Cited

U.S. PATENT DOCUMENTS

| | | | |
|---|---|---|---|
| 6,442,722 B1 * | 8/2002 | Nadeau-Dostie | G01R 31/31858 714/731 |
| 7,613,971 B2 * | 11/2009 | Asaka | G01R 31/31858 714/724 |
| 7,778,790 B2 * | 8/2010 | Furuya | G01R 31/318536 714/728 |

(Continued)

FOREIGN PATENT DOCUMENTS

| | | |
|---|---|---|
| TW | 201430513 A | 8/2014 |
| TW | 201445565 A | 12/2014 |

*Primary Examiner* — Samir W Rizk
*Assistant Examiner* — Enam Ahmed
(74) *Attorney, Agent, or Firm* — Wolf, Greenfield & Sacks, P.C.

(57) ABSTRACT

A multicycle path circuit capable of operating at a functional mode and an at-speed test mode. The multicycle path circuit includes an on-chip controller configured to receive an on-chip clock signal and modulate the on-chip clock signal to provide a first clock signal to a first circuit and a second clock signal to a second circuit. The first clock signal and the second clock signal are in a multicycle phase relationship. The on-chip controller is configured to ensure the clock paths to and from the second circuit to be the same for the functional mode and the at-speed test mode and therefore to avoid hold and setup timing conflict between these modes.

15 Claims, 6 Drawing Sheets

(56) References Cited

U.S. PATENT DOCUMENTS

| | | | | |
|---|---|---|---|---|
| 7,840,861 | B2* | 11/2010 | Sul | G01R 31/31937 |
| | | | | 714/731 |
| 8,726,113 | B2* | 5/2014 | Rajski | G01R 31/31723 |
| | | | | 714/728 |
| 10,032,502 | B1* | 7/2018 | Gopalan | G06F 3/065 |
| 11,119,530 | B1* | 9/2021 | Pinskiy | G06F 30/396 |
| 2006/0179376 | A1* | 8/2006 | Asaka | G01R 31/31858 |
| | | | | 714/731 |
| 2012/0036171 | A1 | 2/2012 | Rindner | |
| 2014/0101505 | A1* | 4/2014 | Tekumalla | G01R 31/318552 |
| | | | | 714/E11.155 |

* cited by examiner

METHOD AND CIRCUIT FOR AT-SPEED TESTING OF MULTICYCLE PATH CIRCUITS

RELATED APPLICATIONS

This application claims priority to and the benefit of U.S. Provisional Application Ser. No. 63/118,994, filed Nov. 30, 2020 and entitled "METHOD AND CIRCUIT FOR AT-SPEED TESTING OF MULTICYCLE PATHS," which is hereby incorporated herein by reference in its entirety.

TECHNICAL FIELD

This application relates generally to multicycle path circuits.

BACKGROUND

Semiconductor chips may be tested to verify their operation. Testing of semiconductor chips entails applying numerous combinations of signal patterns by a testing device. Given the complexity of modern integrated circuits, the number of patterns that need to be tested may be in the thousands, hundreds of thousands, or more. Automatic test pattern generation (ATPG) refers to generating the various permutations of test patterns to thoroughly test a chip.

SUMMARY

Some embodiments relate to a multicycle path circuit comprising: a logic circuit configured to operate with a first clock signal of a first time period; a memory coupled to the logic circuit and configured to operate with a second clock signal of a second time period that is a multiple of the first time period; and an on-chip clock controller coupled to the first and second circuits and configured to provide the first clock signal to the first circuit and the second clock signal to the second circuit, wherein the multicycle path circuit is configured to operate in a functional mode in which the logic circuit controls read and/or write of the memory, and wherein the multicycle path circuit is configured to operate in an at-speed test mode in which the logic circuit controls read and/or write of the memory to test a transition, over a plurality of clock cycles of the first clock signal, of a value output from the memory.

Some embodiments relate to an on-chip controller configured to provide clock signals to first and second circuits coupled to each other and operating with first and second clock signals in a multicycle phase relationship, the on-chip controller comprising: a first pulse shaper that receives an on-chip clock signal and outputs a first test clock enable signal; and a second pulse shaper that receives the on-chip clock signal and outputs a second test clock enable signal such that the on-chip controller provides the first and second clock signals to the first and second circuits based at least in part on the first and second test clock enable signals.

Some embodiments relate to a system comprising: first and second circuits coupled to each other and operating with first and second clock signals in a multicycle phase relationship; a first on-chip clock controller configured to modulate an on-chip clock signal to provide the first and second clock signals to the first and second circuits; and a second on-chip clock controller configured to provide the on-chip clock signal to the first on-chip clock controller based on a scan clock signal.

The foregoing summary is provided by way of illustration and is not intended to be limiting.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Described herein are multicycle path circuits testable at-speed. The inventors have recognized and appreciated that the test patterns generated by automatic test pattern generator (ATPG) tools are only capable of supporting circuits that are accessible within one clock cycle. A multicycle path circuit, which may not complete the propagation of the signals along one or more of its paths within one clock cycle, is not testable using ATPG tools. Accordingly, defective multicycle path circuits may go undetected. As defective multicycle paths cannot be detected, chips with defective multicycle path circuits would show as defect parts per million (DPPM) and therefore reduce yield.

The inventors have developed methods and circuits to accomplish at-speed testing for multicycle path circuits. In some embodiments, a multicycle path circuit may be capable of operating at a functional mode and an at-speed test mode. The multicycle path circuit may include an on-chip controller configured to provide a first clock signal to a first circuit and a second clock signal to a second circuit. The first clock signal and the second clock signal may be in a multicycle phase relationship. The second clock signal may have a time period that is a multiple of that of the first clock signal. The on-chip controller may be configured to ensure the clock paths to the first and the second circuit to be the same for the functional mode and the at-speed test mode and therefore to avoid hold and setup timing conflict between these modes due to clock divergence.

Figure 1:
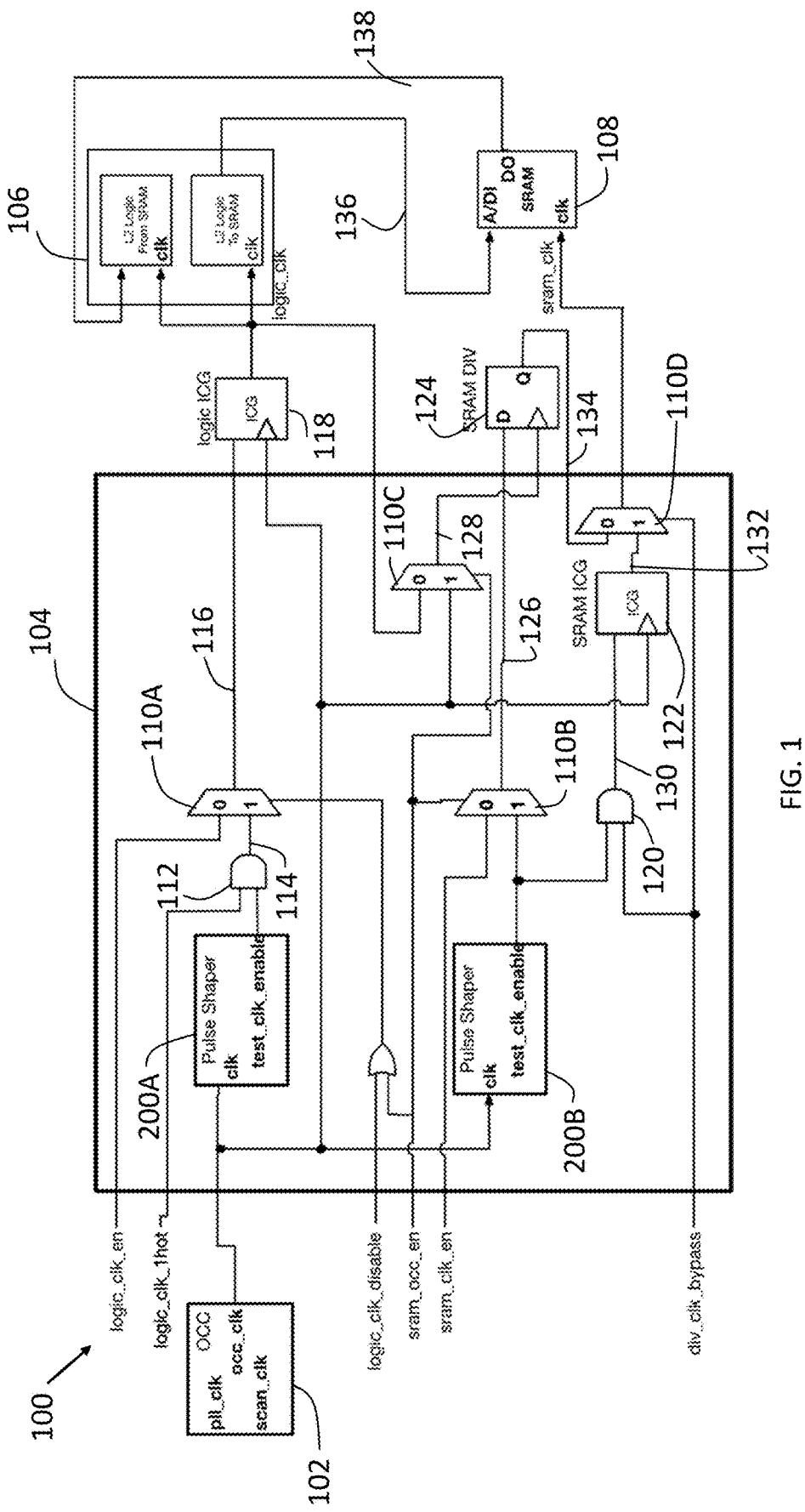
FIG. 1 is a block diagram of a multicycle path circuit, according to some embodiments.

FIG. 1 is a block diagram of a multicycle path circuit 100, according to some embodiments. In the illustrated example, the multicycle path circuit 100 includes a logic circuit 106 and a static random-access memory (SRAM) 108. The logic circuit 106 may be configured to operate with a clock signal logic_clk. The logic circuit 106 may be configured to control the write and read of the SRAM 108 by providing an output data signal 136 to an input terminal A/DI of the SRAM 108 and receiving an output signal 138 from an output terminal DO of the SRAM 108. The SRAM 108 may be configured to operate with a clock signal sram_clk that is a multiple of the time period of the clock signal logic_clk because the data is expected to be held for two or more CPU logic clocks during SRAM write 136 and read operations 138 (See FIG. 3).

The multicycle path circuit 100 may include an on-chip clock controller (OCC) 102. The OCC 102 may receive a clock signal pll_clk, which may be generated by a phase-locked loop (PLL) circuit (not shown). The OCC 102 may also receive a clock signal scan_clk, which may be provided by Automated Test Equipment ATE. The OCC 102 may output a clock signal occ_clk based on the clock signal pll_clk and the clock signal scan_clk.

The multicycle path circuit 100 may include a Custom OCC 104 that provides dock signals to the logic circuit 106 and SRAM 108 based on the mode of operation. In a functional mode of operation no testing is performed, and the Custom OCC allows the clock signals to pass to the logic circuit 106 and SRAM 108 based on functional logic (not shown).

The Custom OCC 104 may include a first part that includes a pulse shaper 200A, an AND gate 112, a multiplexer 110A. In the functional mode an OR gate 111 receives logic_clk disable and sram_occ_en and produces a signal that causes the multiplexer 110A to select the 0 input, which is logic_clk_en. The signal logic_clk_en passes through the multiplexer as signal 116, and enables the Integrated Clock Gater (ICG) 118 based on the functional logic. The ICG 118 receives a clock input of occ_clk. The ICG 118 then provides the logic_clk to the logic circuit 106, which in the functional mode is occ_clk as gated by logic clk_en.

In a testing mode the Custom OCC 104 provides a test signal for gating the ICG 118. The pulse shaper 200A may receive the clock signal occ_clk and generate a test clock enable signal test_clk_enable based at least in part on the clock signal occ_clk. The AND gate 112 may receive the test clock enable signal test_clk_enable and a test control signal logic_clk_1hot, which is set to zero if the Custom OCC 104 is to provide ATPG stuck-at SRAM coverage (see FIG. 4). The AND gate 112 may provide an output signal 114 to the multiplexer 110A. The multiplexer 110A may also receive a signal logic_clk_en, and a control signal sram_occ_en ORed with logic_clk_disable 140. logic_clk_disable is set one and sram_occ_en is set zero to obtain ATPD stuck-at SRAM coverage on A/DI pins of SRAM circuit 108. The multiplexer 110A may generate an output signal 116 based on the signal logic_clk_en or the signal 114 controlled by the control signal 140.

The Custom OCC 104 may include a second part that includes a pulse shaper 200B, multiplexers 110B-D, an AND gate 120, and ICG 122. In the functional mode the multiplexer 110B is controlled by sram_occ_en to select the 0 input, which is sram_clk_en. The pulse shaper 200B may receive the clock signal occ_clk and generate a test clock enable signal test_clk_enable based at least in part on the clock signal occ_clk. The multiplexer 110B may receive the test clock enable signal test_clk_enable and a signal sram_clk_en. The multiplexer 110B may generate an output signal 126. The multiplexer 110C may generate an output signal 128 based on the clock signal logic_clk and the clock signal occ_clk controlled by the control signal sram_occ_en. The AND gate 120 may generate an output signal 13( )based on the test clock enable signal test_clk_enable provided by the pulse shaper 200B and a control signal div_clk_bypass. The ICG 122 may generate an output signal 132 based on the signal 130 output by the AND gate 120 and the clock signal occ_clk.

The multicycle path circuit 100 may include a divider 124. The divider 124 may generate an output signal 134 based on the signal 128 output by the multiplexer 110O and the signal 126 output by the multiplexer 110B. The divider 124 may be configured to divide the signal 128 output by the multiplexer 110C into a multiphase clock controlled by the signal 126 output by the multiplexer 110B.

The multiplexer 110D may generate an output signal based on the signal 132 output by the ICG 122 and the signal 134 output by the divider 124 controlled by the control signal div_clk_bypass. The output signal of the multiplexer 110D may be provided to the SRAM 108 as the clock signal sram_clk.

Figure 2:
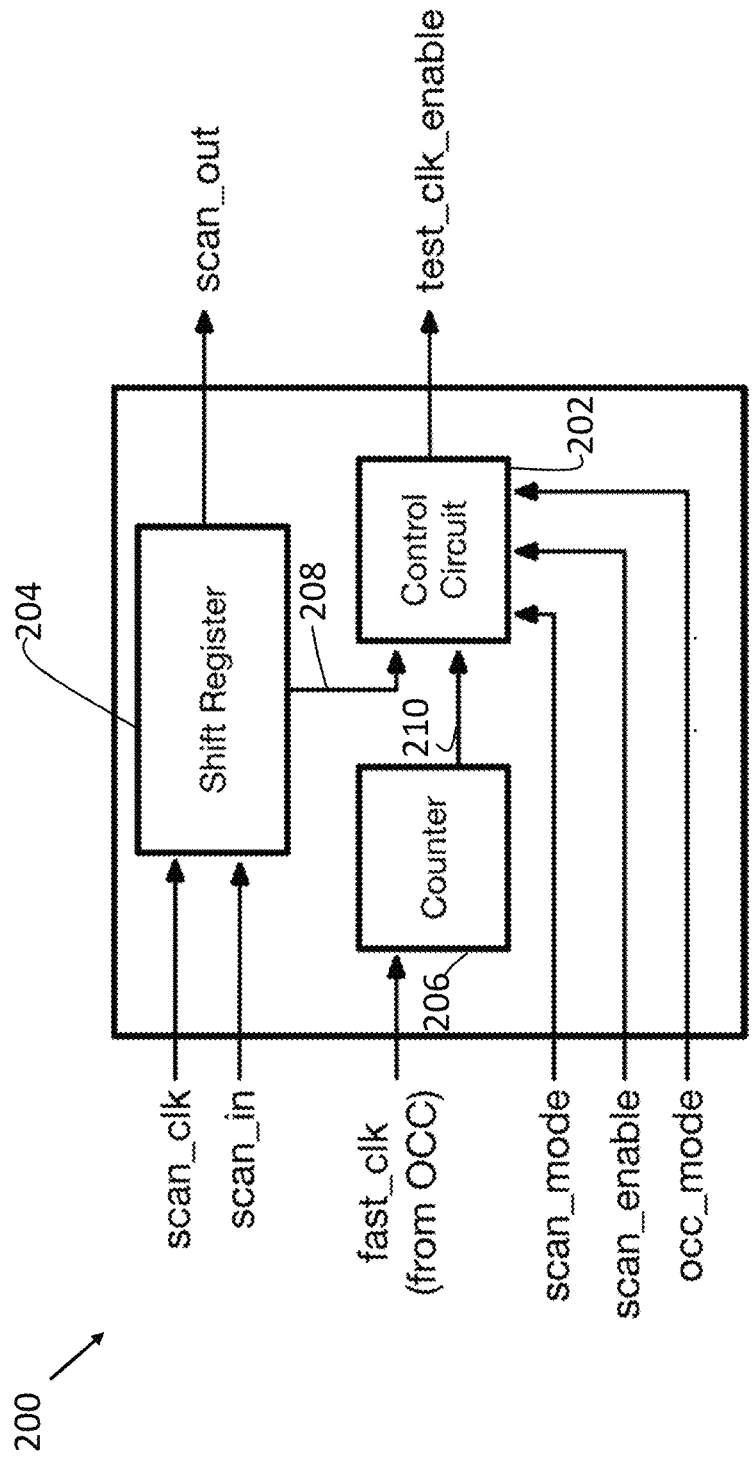
FIG. 2 is a block diagram of a pulse shaper of the multicycle path circuit of FIG. 1, according to some embodiments.

FIG. 2 is a block diagram of a pulse shaper 200 of the multicycle path circuit 100, according to some embodiments. The pulse shaper 200 may include a shift register 204 configured to receive the clock signal scan_clk and the data signal scan_in that may be provided by ATE. The shift register 204 may generate an output signal scan_out and an output signal 208 based on the clock signal scan_clk and the data signal scan_in.

The pulse shaper 200 may include a counter 206 configured to receive a clock signal occ_clk from the OCC 102. The counter 206 may generate an output signal 210 based on the clock signal occ_clk.

The pulse shaper 200 may include a control circuit 202 configured to receive the signal 208 generated by the shift register 204, the signal 210 generated by the counter 206, a signal scan_mode, a signal scan_enable, and a signal occ_mode. The control circuit 202 may generate the test clock enable signal test_clk_enable based on the signals 208, 210, scan_mode, scan_enable, and occ_mode.

Figure 3:
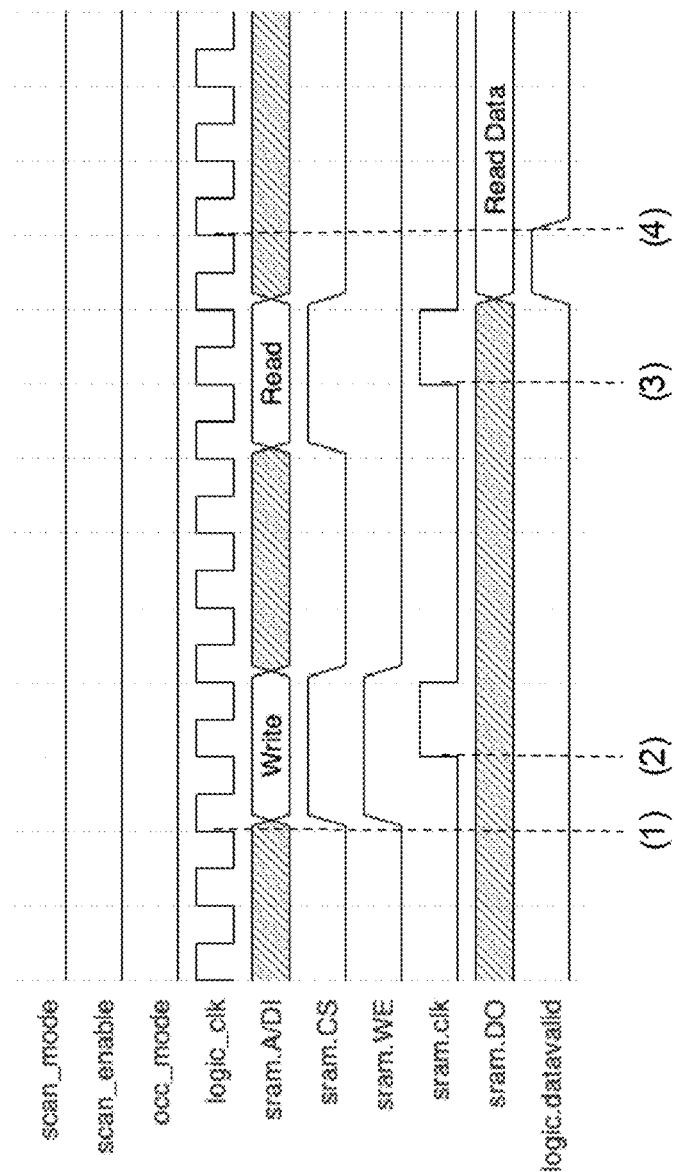
FIG. 3 is a time diagram of the multicycle path circuit of FIG. 1 in a functional mode, according to some embodiments.

FIG. 3 is a timing diagram of the multicycle path circuit 100 in a functional mode, according to some embodiments. In the functional mode, logic_clk_en and sram_clk_en control the ICG 118 and the divider 124, respectively. Test mode signals such as scan_mode, scan_enable, occ_mode, logic_clk_1hot, logic_clk_disable, sram_occ_en, and div_clk_bypass are set to zero. As illustrated, the inputs of SRAM 108 (A/DI/CS/WE) may hold for a multiple cycles of the logic_clk. At time (1), the logic circuit 106 may launch the clock for a write operation. At time (2), the SRAM 108 may perform the write operation. At time (3), the SRAM 108 may launch the clock for a read operation. At time (4), when a data valid signal logic.datavalid indicates a valid data, the logic circuit 106 may read the data. output by the SRAM 108, which may take multiple cycles of the logic_clk.

Figure 4:
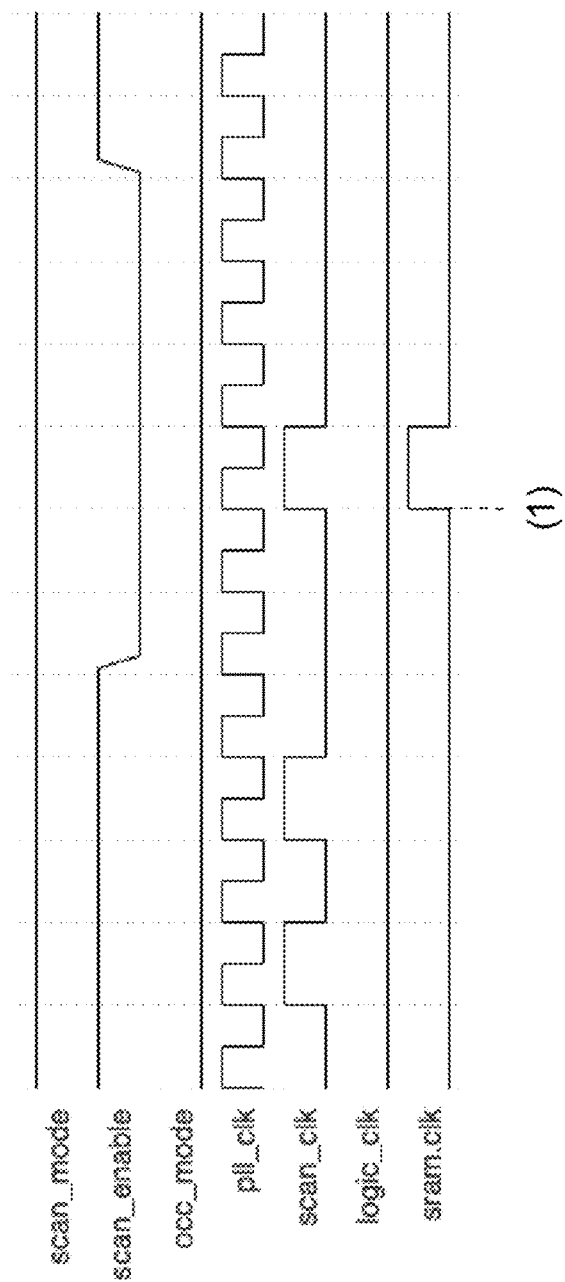
FIG. 4 is a time diagram of the multicycle path circuit of FIG. 1 in a test mode, according to some embodiments.

FIG. 4 is a timing diagram of the multicycle path circuit 100 in a stuck-at test mode, according to some embodiments. Scan_mode is high, and occ_mode is low, indicating that the multicycle path circuit 100 is in the stuck-at test mode. In the stuck-at test mode, the multicycle path circuit 100 is configured to test whether path 136 has a stuck-at fault (stuck at zero or one). In the stuck-at test mode the signal logic_clk may be set to zero setting the test control signal logic_clk_1hot to zero, logic_clk_disable to one, sram_occ_en to zero, and div_clk_bypass to one. By providing a signal pattern to path 136 (e.g., using a design for test methodology) and capturing the value on the DO terminal of the SRAM 108, a stuck-at fault on path 136 can be detected.

Figure 5:
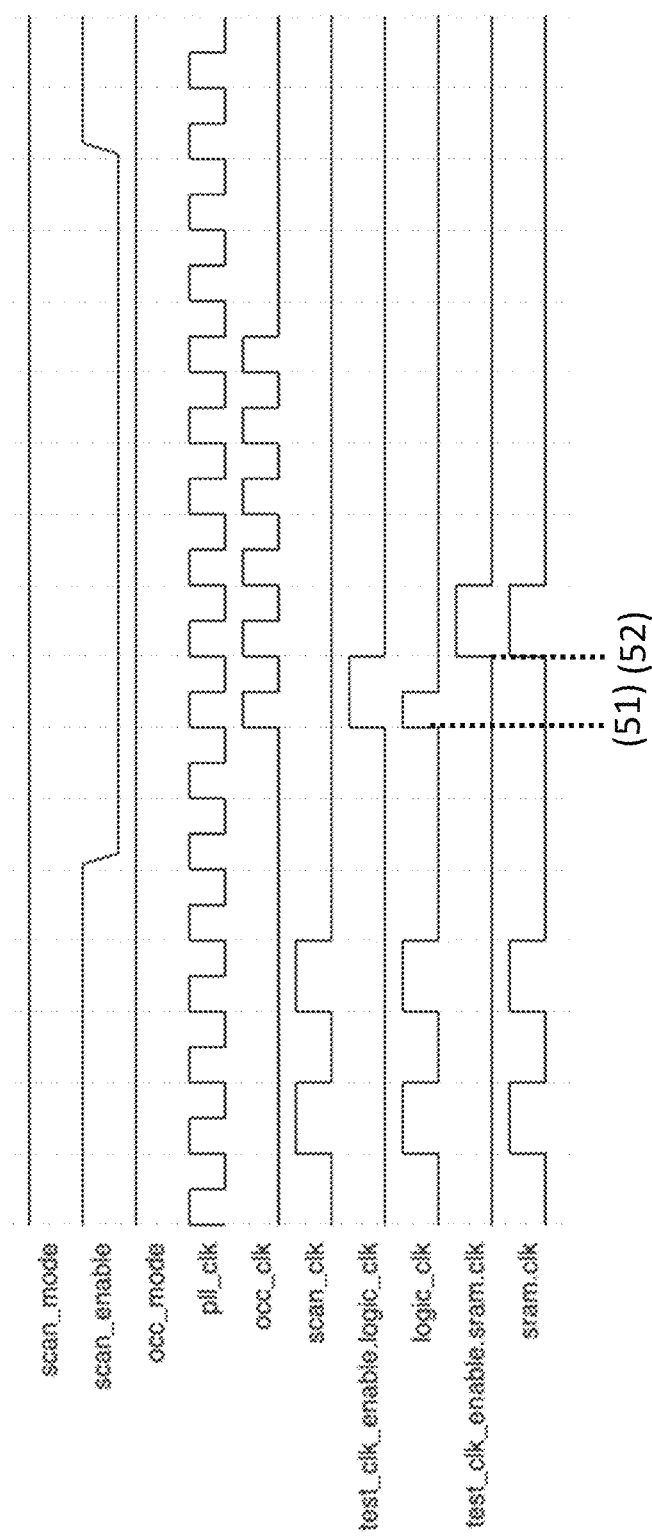
FIG. 5 is a time diagram of the multicycle path circuit of FIG. 1 in a test mode, according to some embodiments.

FIG. 5 is a time diagram of the multicycle path circuit 100 in an at-speed test mode, according to some embodiments. Scan_mode is high, and occ_mode is high, indicating that the multicycle path circuit 100 is in the at-speed test mode. In the at-speed test mode, the multi cycle path circuit 100 may perform an at-speed write operation. The test control signals logic_clk_1hot and sram_occ_en may be set to one, and div_clk_bypass, logic_clk_disable may be set to zero.

As illustrated, at time (51) and time (52), logic_clk and sram_clk may be provided with pulses that simulate the pulses at time (1) and time (2) of FIG. 3 when the multicycle path circuit 100 is in the functional mode. It is then observed whether the DO terminal of the SRAM 108 makes the transition with the correct timing.

Figure 6:
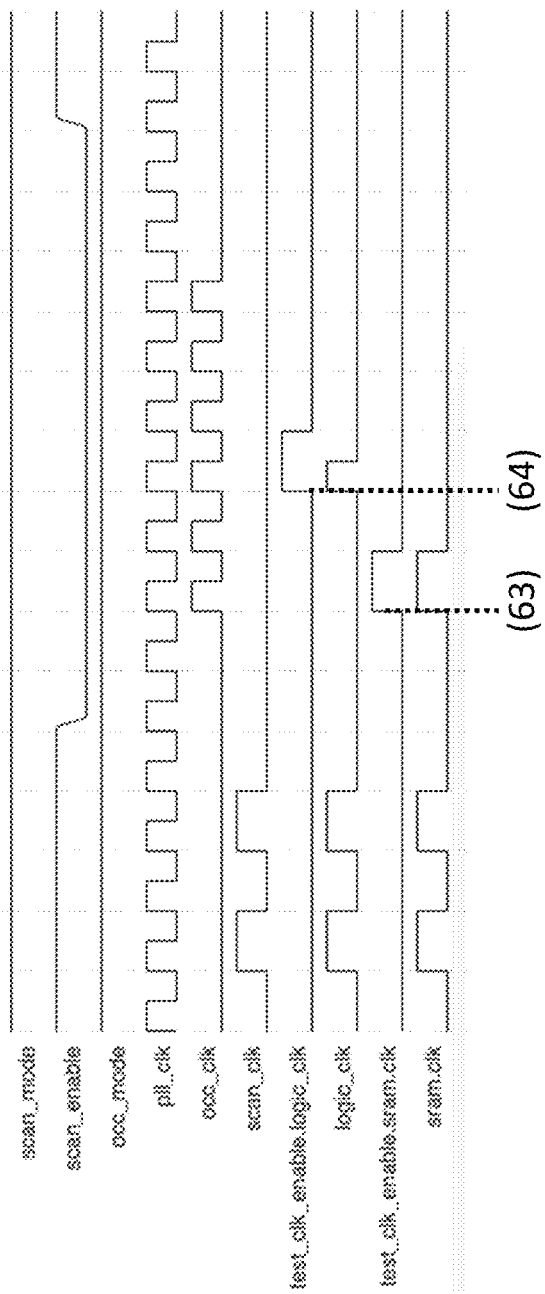
FIG. 6 is a time diagram of the multicycle path circuit of FIG. 1 in a test mode, according to some embodiments.

FIG. 6 is a timing diagram of the multicycle path circuit 100 in an at-speed test mode, according to some embodiments. In this test mode, the multicycle path circuit 100 may perform an at-speed read operation. The test control signals logic_clk_1hot and sram_occ_en may be set to one, and div_clk_bypass, logic_clk_disable may be set to zero. As illustrated, at time (63) and time (64), logic_clk and sram_clk may be provided with pulses that simulate the pulses at time (3) and time (4) of FIG. 3 when the multicycle path circuit 100 is in the functional mode. It is then observed whether the DO terminal of the SRAM 108 makes the transition with the correct timing.

Various changes may be made to the illustrative structures shown and described herein. For example, the on-chip clock controller was described in connection with a multicycle path circuit having a logic circuit and an SRAM, On-chip clock controllers may be used in connection with any suitable multicycle path circuits. As a specific example of a possible variation, on-chip clock controllers may be used in connection with a multicycle path circuit having two logic circuits.

Various aspects of the apparatus and techniques described herein may be used alone, in combination, or in a variety of arrangements not specially discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A multicycle path circuit comprising:
a logic circuit configured to operate with a first clock signal of a first time period;
a memory coupled to the logic circuit and configured to operate with a second clock signal of a second time period that is a multiple of the first time period; and
an on-chip clock controller coupled to the logic circuit and the memory and configured to provide the first clock signal to the logic circuit and the second clock signal to the memory,
wherein the multicycle path circuit is configured to operate in a functional mode in which the logic circuit controls read and/or write of the memory, and
wherein the multicycle path circuit is configured to operate in an at-speed test mode in which the logic circuit controls read and/or write of the memory to test a transition, over a plurality of clock cycles of the first clock signal, of a value output from the memory,
wherein the on-chip clock controller is configured to ensure clock paths to the logic circuit and the memory are the same for the functional mode and the at-speed test mode to avoid hold and setup timing conflict between the functional mode and test mode due to clock divergence.

2. The multicycle path circuit of claim 1, wherein:
the on-chip clock controller receives an on-chip clock signal and modulates the on-chip clock signal to generate the first and second clock signals.

3. A multicycle path circuit comprising:
a logic circuit configured to operate with a first clock signal of a first time period;
a memory coupled to the logic circuit and configured to operate with a second clock signal of a second time period that is a multiple of the first time period; and
an on-chip clock controller coupled to the logic circuit and the memory and configured to provide the first clock signal to the logic circuit and the second clock signal to the memory,
wherein the multicycle path circuit is configured to operate in a functional mode in which the logic circuit controls read and/or write of the memory, and
wherein the multicycle path circuit is configured to operate in an at-speed test mode in which the logic circuit controls read and/or write of the memory to test a transition, over a plurality of clock cycles of the first clock signal, of a value output from the memory,
wherein the on-chip clock controller receives an on-chip clock signal and modulates the on-chip clock signal to generate the first and second clock signals,
wherein the on-chip clock controller comprises:
a first pulse shaper that receives the on-chip clock signal and outputs a first test clock enable signal, and
a second pulse shaper that receives the on-chip clock signal and outputs a second test clock enable signal.

4. The multicycle path circuit of claim 3, wherein:
the on-chip clock controller comprises a first multiplexer that provides the first test clock enable signal to an integrated clock gater that gates the on-chip clock signal and provides a gated version of the on-chip clock signal to the logic circuit when the multicycle path circuit operates in the at-speed test mode.

5. The multicycle path circuit of claim 3, wherein:
the first pulse shaper comprises
a first control circuit that generates the first test clock enable signal,
a first shift register coupled to the first control circuit, and
a first counter coupled to the first control circuit.

6. The multicycle path circuit of claim 3, wherein:
the second pulse shaper comprises
a second control circuit that generates the second test clock enable signal,
a second shift register coupled to the second control circuit, and
a second counter coupled to the second control circuit.

7. The multicycle path circuit of claim 1, wherein:
the multicycle path circuit comprises a divider configured to produce the second clock signal from the first clock signal.

8. The multicycle path circuit of claim 1, wherein:
the multicycle path circuit is further configured to operate in a stuck-at test mode to test whether in input to the memory is stuck at a logic value.

9. The multicycle path circuit of claim 3, wherein the on-chip clock controller is configured to ensure clock paths to the logic circuit and the memory are the same for the functional mode and at-speed test mode to avoid hold and setup timing conflict between the functional mode and test mode due to clock divergence.

10. An on-chip controller configured to provide clock signals to first and second circuits coupled to each other and operating with first and second clock signals in a multicycle phase relationship, the on-chip controller comprising:
 a first pulse shaper that receives an on-chip clock signal and outputs a first test clock enable signal; and
 a second pulse shaper that receives the on-chip clock signal and outputs a second test clock enable signal such that the on-chip controller provides the first and second clock signals to the first and second circuits based at least in part on the first and second test clock enable signals.

11. The on-chip controller of claim 10, wherein:
the first pulse shaper comprises
 a first control circuit that generates the first test clock enable signal,
 a first shift register coupled to the first control circuit, and
 a first counter coupled to the first control circuit.

12. The on-chip controller of claim 10, wherein:
the second pulse shaper comprises
 a second control circuit that generates the second test clock enable signal,
 a second shift register coupled to the second control circuit, and
 a second counter coupled to the second control circuit.

13. A system comprising:
first and second circuits coupled to each other and operating with first and second clock signals in a multicycle phase relationship;
a first on-chip clock controller configured to modulate an on-chip clock signal to provide the first and second clock signals to the first and second circuits; and
a second on-chip clock controller configured to provide the on-chip clock signal to the first on-chip clock controller based on a scan clock signal,
wherein the first on-chip clock controller comprises
 a first pulse shaper that receives the on-chip clock signal and outputs a first test clock enable signal, and
 a second pulse shaper that receives the on-chip clock signal and outputs a second test clock enable signal.

14. The system of claim 13, wherein:
the first pulse shaper comprises
 a first control circuit that generates the first test clock enable signal,
 a first shift register receiving the scan clock signal and coupled to the first control circuit, and
 a first counter coupled to the first control circuit.

15. The system of claim 13, wherein:
the second pulse shaper comprises
 a second control circuit that generates the second test clock enable signal,
 a second shift register receiving the scan clock signal and coupled to the second control circuit, and
 a second counter coupled to the second control circuit.

\* \* \* \* \*